(12) United States Patent
Furuta et al.

(10) Patent No.: US 6,908,293 B2
(45) Date of Patent: Jun. 21, 2005

(54) RESIN ENCAPSULATION SYSTEM

(75) Inventors: Ichirou Furuta, Kumamoto (JP); Akira Kajiwara, Kurume (JP)

(73) Assignees: NEC Electronics Corporation, Kanagawa (JP); Asahi Engineering K.K., Fukuoka (JP)

( * ) Notice: Subject to any disclaimer, the term of this patent is extended or adjusted under 35 U.S.C. 154(b) by 219 days.

(21) Appl. No.: 10/140,055

(22) Filed: May 8, 2002

(65) Prior Publication Data

US 2002/0180066 A1 Dec. 5, 2002

(30) Foreign Application Priority Data

May 9, 2001 (JP) ........................................ 2001-139045

(51) Int. Cl.[7] .......................... B29C 45/14; B29C 70/72
(52) U.S. Cl. ...................... 425/116; 425/121; 425/125; 425/215; 425/544; 425/575; 425/453
(58) Field of Search ................................. 425/116, 121, 425/125, 215, 544, 575, 453

(56) References Cited

U.S. PATENT DOCUMENTS

| | | | | |
|---|---|---|---|---|
| 5,484,274 A | * | 1/1996 | Neu | 425/116 |
| 5,654,017 A | * | 8/1997 | Harmsen | 425/116 |
| 6,050,802 A | * | 4/2000 | Kobayashi | 425/116 |

FOREIGN PATENT DOCUMENTS

| | | | | |
|---|---|---|---|---|
| JP | 62150834 A | * | 7/1987 | ........... H01L/21/56 |
| JP | H03-91937 A | | 4/1991 | |
| JP | 06-314717 A | | 11/1994 | |
| JP | 7-32414 A | | 2/1995 | |
| JP | 8-25424 A | | 1/1996 | |
| JP | 9-48041 A | | 2/1997 | |
| JP | 09076276 A | * | 3/1997 | ........... H01L/21/56 |
| JP | 09-153506 A | | 6/1997 | |
| JP | 10189624 A | * | 7/1998 | ........... H01L/21/56 |
| JP | H11-286022 A | | 10/1999 | |

OTHER PUBLICATIONS

Partial translation of JP09048041A obtained from the JPO website, the date of the reference is Feb. 18, 1997.*

* cited by examiner

Primary Examiner—Robert B. Davis
(74) Attorney, Agent, or Firm—Sughrue Mion, PLLC

(57) ABSTRACT

In a resin encapsulation system, one or more middle molds remain free without being mechanically connected with an upper mold and a lower mold. The middle mold is circulated, by a middle-mold conveying mechanism, among a molding press, a middle-mold preheating unit, a middle-mold cleaning unit, and an ejecting pressing unit adapted to separate an encapsulated object, a runner, and a gate from the middle mold. Resin encapsulation molding is performed in the circulating process described above.

10 Claims, 8 Drawing Sheets

RESIN ENCAPSULATION SYSTEM

BACKGROUND OF THE INVENTION

1. Field of the Invention

The present invention relates to resin encapsulation systems used for subjecting semiconductor devices to resin encapsulation molding and, more particularly, to a resin encapsulation system using three plastic molds: an upper mold, a middle mold, and a lower mold.

2. Description of the Related Art

This kind of resin encapsulation system is used in a process for encapsulating semiconductor chips, which are cut from wafers in several manufacturing processes for semiconductor devices, in mold resin. In order to manufacture semiconductor devices with high efficiency, the efficiency of the resin encapsulation molding process must be improved.

To be more specific, the resin process can be subdivided into a step of releasing an object encapsulated with resin from a mold, a step of releasing a runner and a gate from the mold and a process to clean the middle mold. In order to improve the efficiency of the resin encapsulation process, these steps should be done automatically and rapidly.

Referring to FIG. 1, this kind of resin encapsulation system generally uses an upper mold 602, a middle mold 601, and a lower mold 603. Since, the middle mold 601 is connected with both the upper mold 602 and the lower mold 603 via links 604, the middle mold 601 moves according to movement of the upper mold 602 and the lower mold 603.

In Japanese Unexamined Patent Application Publication No. 153506/1997 and No. 314717/1994, a three-mold structure including upper, middle, and lower molds are disclosed. FIGS. 2A and 2B refer to typical views disclosed in Japanese Unexamined Patent Application Publication No. 314717/1994 and the details are described below.

FIG. 2A is a perspective view of a mold-releasing load-measuring mold disclosed in Japanese Unexamined Patent Application Publication No. 314717/1994, and FIG. 2B is a sectional view thereof.

As shown in the drawings, the mold-releasing load-measuring mold is formed of an upper mold 701, a middle mold 702, and a lower mold 703.

A resin injection hole 704 formed in, e.g., a circular truncated cone shape, is formed in the upper mold 701 communicated with a resin input port 706 of a transfer molding machine 705.

A cavity portion 709, a runner portion 707, and a gate portion 708 are formed on the middle mold 702 to allow the runner portion 707 to communicate with the cavity portion 709 via the gate portion 708.

A mold-releasing load-measuring method using the mold-releasing load-measuring mold is described in detail below.

First, the mold-releasing load-measuring mold is clamped by, e.g., a pressing force of a cylinder, while laminating the upper mold 701 and the lower mold 703 on the upper and lower faces of the middle mold 702, and then, is input in this state, a mold resin 716 made of, e.g., thermosetting resin, into the resin input port 706 of the transfer molding machine 705.

Then the input mold resin 716 is injected inside the cavity portion 709 via the gate portion 708 while heating the mold resin to melt it.

When the cavity portion 709 and a penetrating hole 712 are filled with the mold resin 716 (see FIG. 3), the resin is made to harden by thermal changes such as heating or cooling.

Then the upper mold 701 and the lower mold 703 are opened to remove only the middle mold 702, as shown in FIG. 3, and pressure is applied to a pressing part 717 provided in the penetrating hole 712 in a predetermined direction, that is, from an exposed surface of the pressing part 717 toward the cavity portion 709, as indicated by arrow B in the figure, by a measuring apparatus such as a spring balance.

Finally, the mold resin 716, which adheres to both side faces 710 and a flat surface 711 of the cavity portion 709, is released from the middle mold 702 by the load acting on the pressing part 717. By reading a scale on the measuring apparatus at that time, the load when the mold resin 716 is released from the middle mold 702 is measured.

Including the above-described examples, this kind of resin encapsulation system in the conventional art has some problems, as described below.

A hollow gate is adopted for the middle mold. Therefore, although it is physically possible to mount an eject mechanism for the gate portion inside a molding press, it is not practical considering procedures and efficiency (called the 'index') of a series of resin encapsulation processes and equipment costs. In other words, it is inappropriate for mass production facilities.

A cleaning mechanism is usually provided in order to remove burrs that remain on the plastic mold after each resin encapsulation. In the three-mold structure, the cleaning mechanism is much too complicated to be practical considering the index and the equipment costs described above and is inappropriate for mass production facilities.

Moreover, since, in the three-mold structure of the conventional art, each mold is fixed by the link described before, maintenance is time-consuming and lowers the productivity, which is a problem.

The mold-releasing load-measuring mold described in FIGS. 2A and 2B is subdivided into three molds: the upper mold, the middle mold, and the lower mold and the cavity portion is formed in the middle mold. However, since there is no machining provided on the middle mold where a conveying mechanism can easily grip it, the conveying mechanism cannot easily remove and insert the middle mold from between the upper mold and the lower mold.

SUMMARY OF THE INVENTION

Accordingly, it is an object of the present invention to provide a low-cost and highly efficient resin encapsulation system.

According to the present invention, in a resin encapsulation system including a molding press using an upper mold, a middle mold, and a lower mold, the resin encapsulation system can be provided with a middle mold conveying mechanism adapted to insert/remove the middle mold into/from the molding press.

DESCRIPTION OF THE PREFERRED EMBODIMENTS

Figure 1:
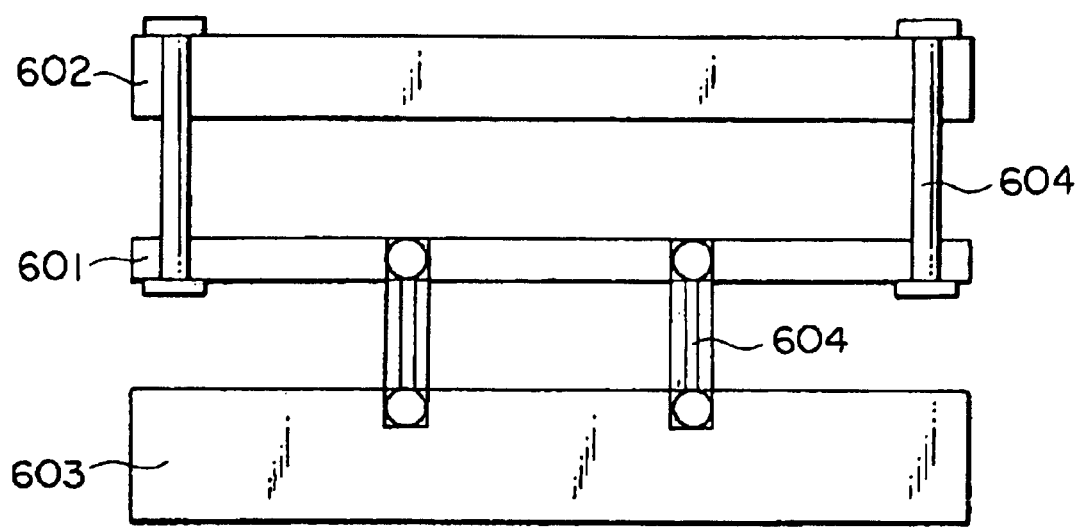
FIG. 1 is a side elevation showing a combination of an upper mold, a middle mold, and a lower mold used for a conventional resin encapsulation system.
Figure 2A:
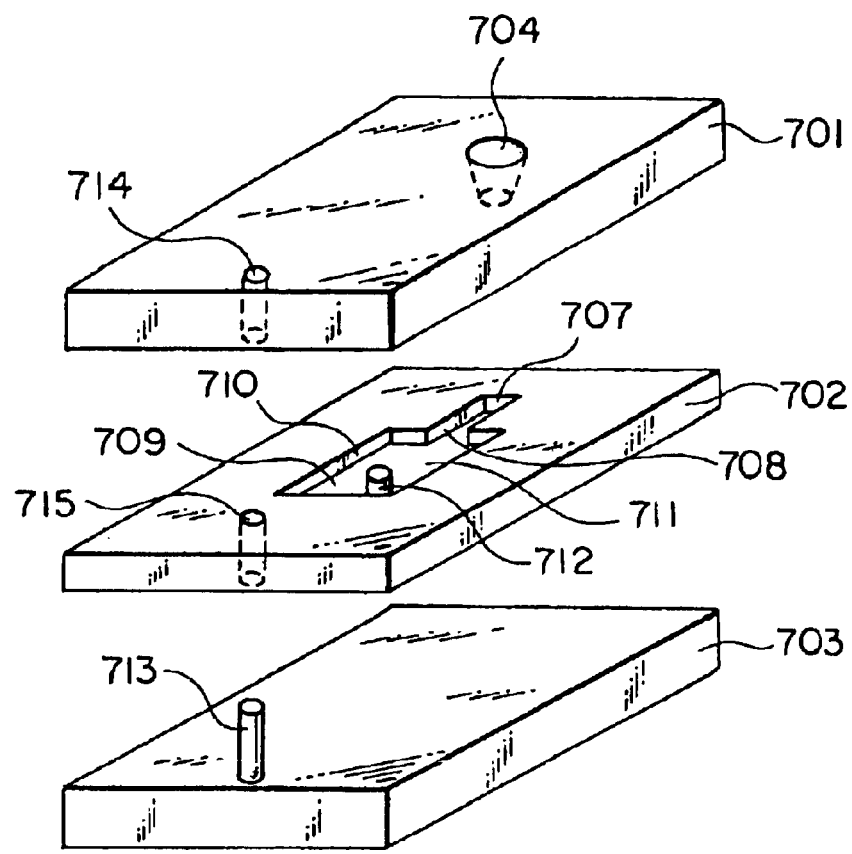
FIG. 2A is an exploded perspective view of a mold-releasing load-measuring mold disclosed in Japanese Unexamined Patent Application Publication No. 314717/1994.
Figure 2B:
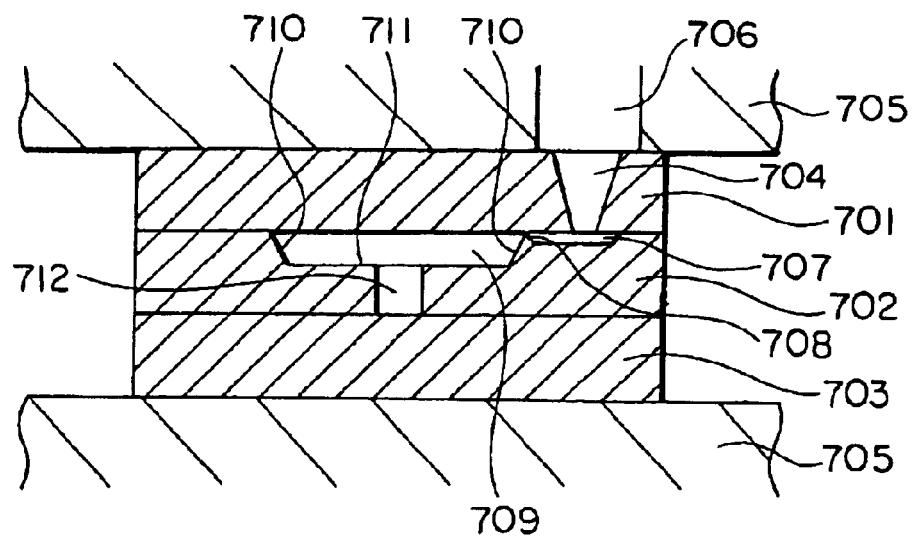
FIG. 2B is a sectional view of the mold-releasing load-measuring mold.
Figure 3:
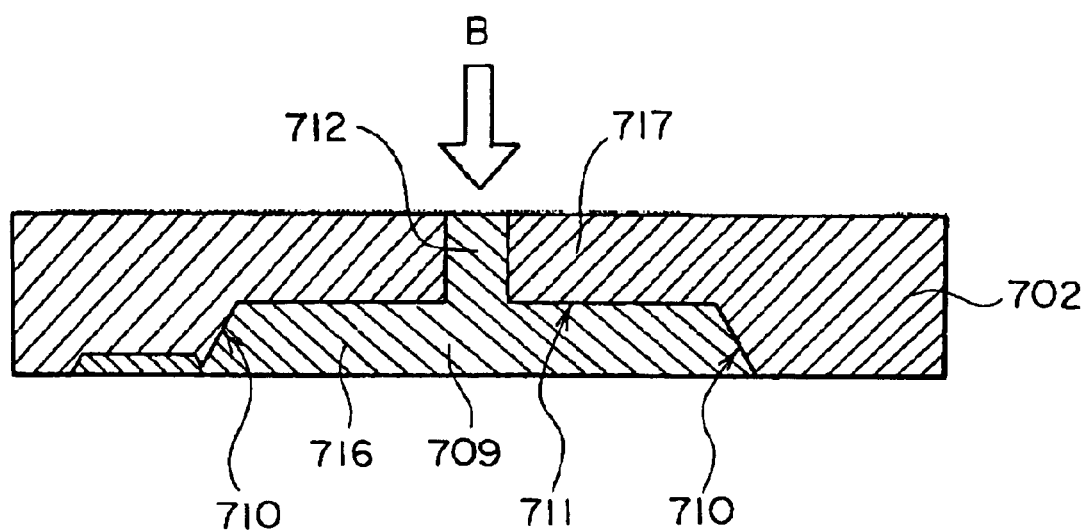
FIG. 3 is a sectional view of a state in which the middle mold is filled with mold resin in the mold-releasing load-measuring mold.

Referring to the drawings, two embodiments of a resin encapsulation system according to the present invention are described.

The resin encapsulation system according to a first embodiment of the present invention comprises a molding press that uses an upper mold, a middle mold and a lower mold.

Figure 4A:
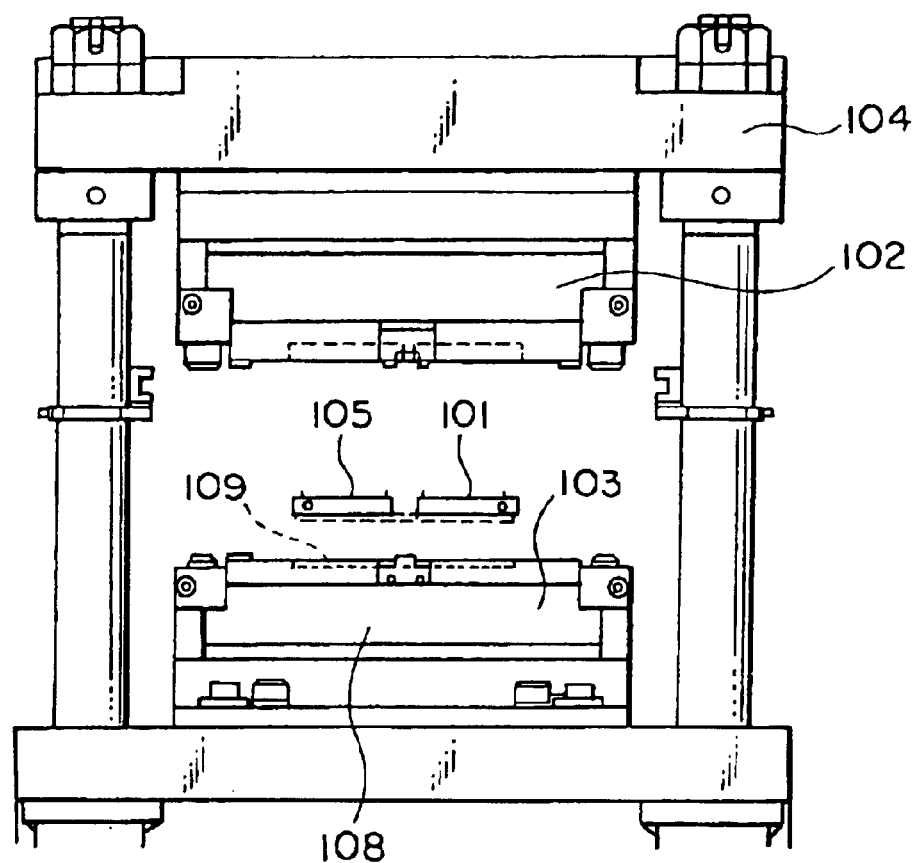
FIG. 4A is a side elevation view of a molding press according to an embodiment of the resin encapsulation system of the present invention.

Referring to FIG. 4A, an upper mold 102 and a lower mold 103 are fixed on a molding press 104 while a middle mold 101 remains free without being fixed to either the upper mold 102 or the lower mold 103. Reference numeral 109 in FIG. 4A indicates a runner portion.

Figure 4B:
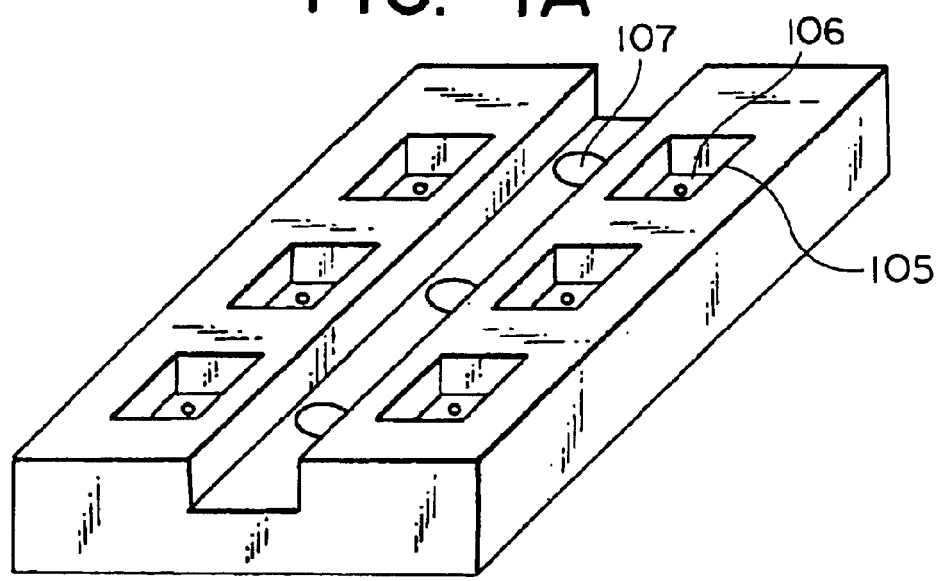
FIG. 4B is a perspective view of the middle mold in the molding press.

FIG. 4B shows a perspective view of the middle mold 101. Referring to FIG. 4B, a cavity portion 105 forming a resin encapsulating portion, a gate portion 106 for injecting resin and a passing hole 107 for tablet-shaped epoxy resin (hereinafter referred to as a tablet) are provided on the middle mold 101. The upper mold 102 serves as a lid to cover the cavity portion 105 of the middle mold 101. A pot 108, into which tablet-shaped epoxy resin, functioning as an encapsulating material, is input, is formed on the lower mold 103.

There is a machining in the middle mold 101, e.g., a notch adapted for being tightly gripped by a hand of a middle mold conveying mechanism in order that the middle mold conveying mechanism receives and tightly fixes the middle mold 101 in a middle mold conveying mechanism.

As this machining, any machining that allows a nail to get inside the middle mold 101 or a part like a handle attached to the middle mold 101 may be used.

Figure 5:
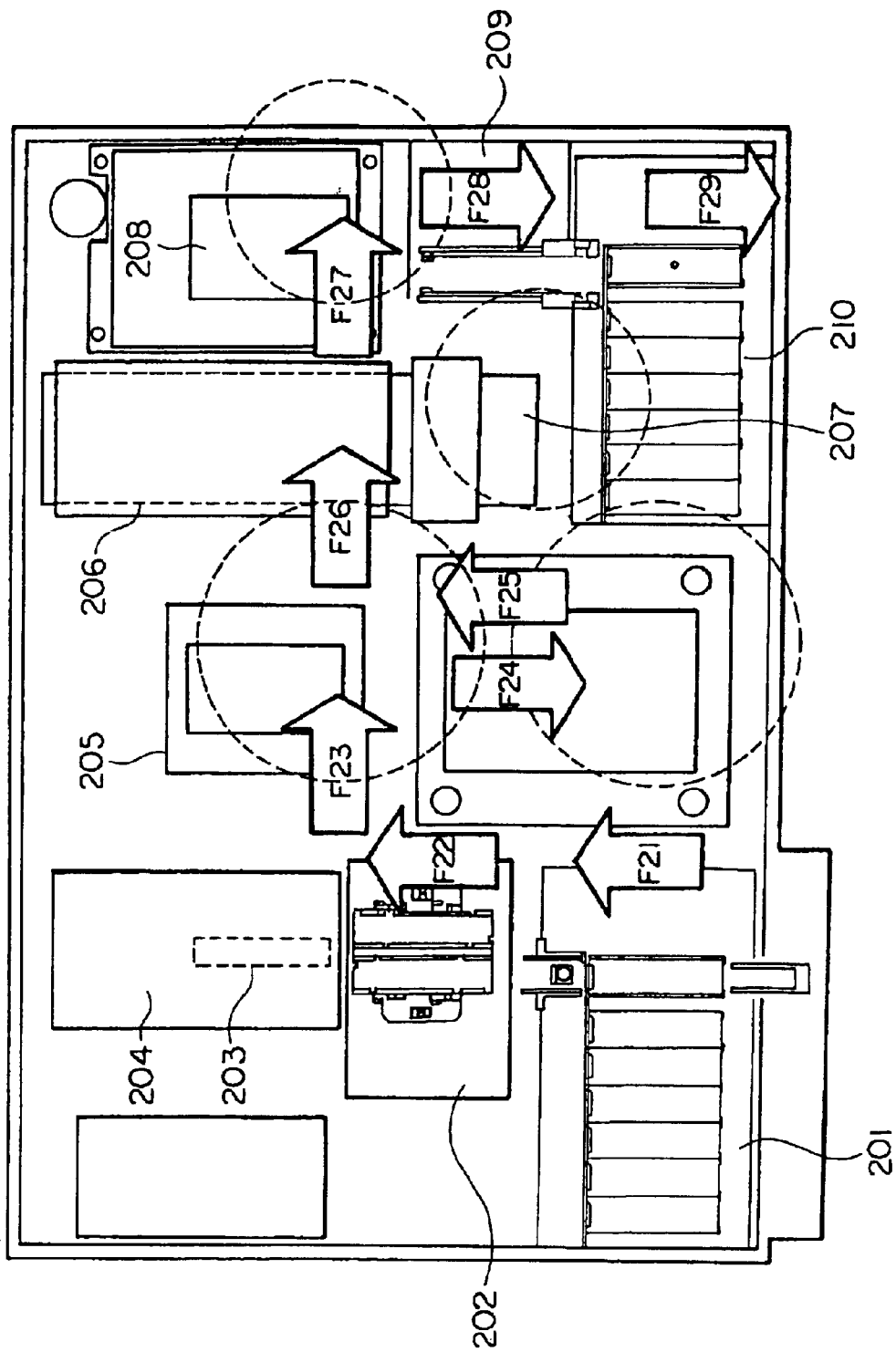
FIG. 5 is an upper view to explain a process for the resin encapsulation system according to a first embodiment of the present invention.

Referring to FIGS. 4A, 4B and 5, the present system comprises a support frame for the whole system, an input magazine buffer unit 201 adapted to set pellets mounted on a lead frame as objects to be encapsulated, a turntable unit 202 adapted to have the objects to be encapsulated arranged thereon, a tablet supplying unit 203 adapted to supply tablets as resin encapsulating material, a loader carrier 204 to receive the objects to be encapsulated on the turntable unit 202 and the tablets supplied from the tablet supplying unit 203, a middle mold preheating unit 205 for preheating the middle mold 101, the molding press 104, a middle-mold off-loader 206 adapted to convey the middle mold 101, a middle-mold cleaning unit 207 adapted to clean the middle mold 101, an ejecting pressing unit 208 to separate the encapsulated object from the middle mold 101 and to separate a runner and a gate from the middle mold 101, a conveyer 209 adapted to convey the final encapsulated object separated from the middle mold 101, and a magazine unit 210 adapted to contain the final encapsulated object. The middle-mold off-loader 206 serves as a part of the hand of the middle mold conveying mechanism.

Although a runner portion is formed on the middle mold according to the present embodiment, it may be formed on the lower mold. It is advantageous if the runner portion is formed on the lower mold while a cavity portion and a gate portion are formed on the middle mold, since the structure of the middle mold can be simplified, thus facilitating fabrication, in that the middle mold need not require a separating mechanism for the runner and the gate mounted on the ejecting pressing unit 208.

Next, referring to FIGS. 4A, 4B and 5, a resin encapsulation process according to the present system is described.

First, a pellet mounted on a lead frame, as an object to be encapsulated, is set in the input magazine buffer unit 201 while tablets made of epoxy resin, as the encapsulating material, are set on the tablet supplying unit 203.

The objects to be encapsulated are discharged one-by-one by the input magazine buffer unit 201, as shown by arrows F21 and F22, to be placed on the turntable unit 202. The tablets are then distributed for loading into the loader carrier 204.

Next, a pair of the objects to be encapsulated, placed in order on the turntable unit 202, is conveyed/set on the middle mold 101, which is set previously on the middle preheating unit 205 by the loader carrier 204, as shown by arrow F23.

Subsequently, until such time as the objects to be encapsulated are removed from the middle mold 101 by the ejecting pressing unit 208, the objects circulate through each unit while remaining on the middle mold 101.

The middle mold 101 is heated up to around 180° C. by the middle mold preheating unit 205 together with the objects to be encapsulated on the middle mold 101, which are then conveyed/set on the lower mold 103 of the molding press 104 by the middle-mold off-loader 206, as shown by arrow F24.

Then the tablet is input from an upper part of the middle mold 101, which is set on the lower mold 103 by the loader carrier 204.

The lower mold 103 and middle mold 101 are lifted in order to clamp them together with upper mold by a fixed pressure.

Injection molding is performed by an injection unit (not shown in the drawings) mounted on the lower mold 103.

After completion of the encapsulation process, the middle mold 101 together with the encapsulated object are removed by the middle-mold off-loader 206 from the lower mold 103 as shown by arrow F25.

The removed middle mold 101 and the encapsulated object are set on the ejecting pressing unit 208 by the middle-mold off-loader 206 as shown by arrow F27 after they are conveyed by the middle-mold off-loader 206 as shown by arrow F26.

Firstly, the encapsulated object is separated from the middle mold 101 by the ejecting pressing unit 208 and picked up by an arm (not shown in the drawings) of the ejecting pressing unit 208 placed on the conveyer 209 then conveyed to the magazine unit 210 as shown by arrows F28 and F29. After that, the middle mold 101 is separated from the runner and the gate.

Although a conveying hand between each unit of the middle mold 101 (a middle mold conveying mechanism) is not shown in the drawings, a variety of types can be used such as a type to scoop up from a lower position like a fork lift, a type to hold the middle mold 101 in an upper position for conveying and a type to form a hole on a side face of the middle mold 101 so that a rod can be inserted into the hole for lifting.

By repeating the processes above, the resin encapsulation process is performed.

The resin encapsulation system according to a second embodiment of the present invention comprises a molding press that has an upper mold, a lower mold and two middle molds.

Figure 6:
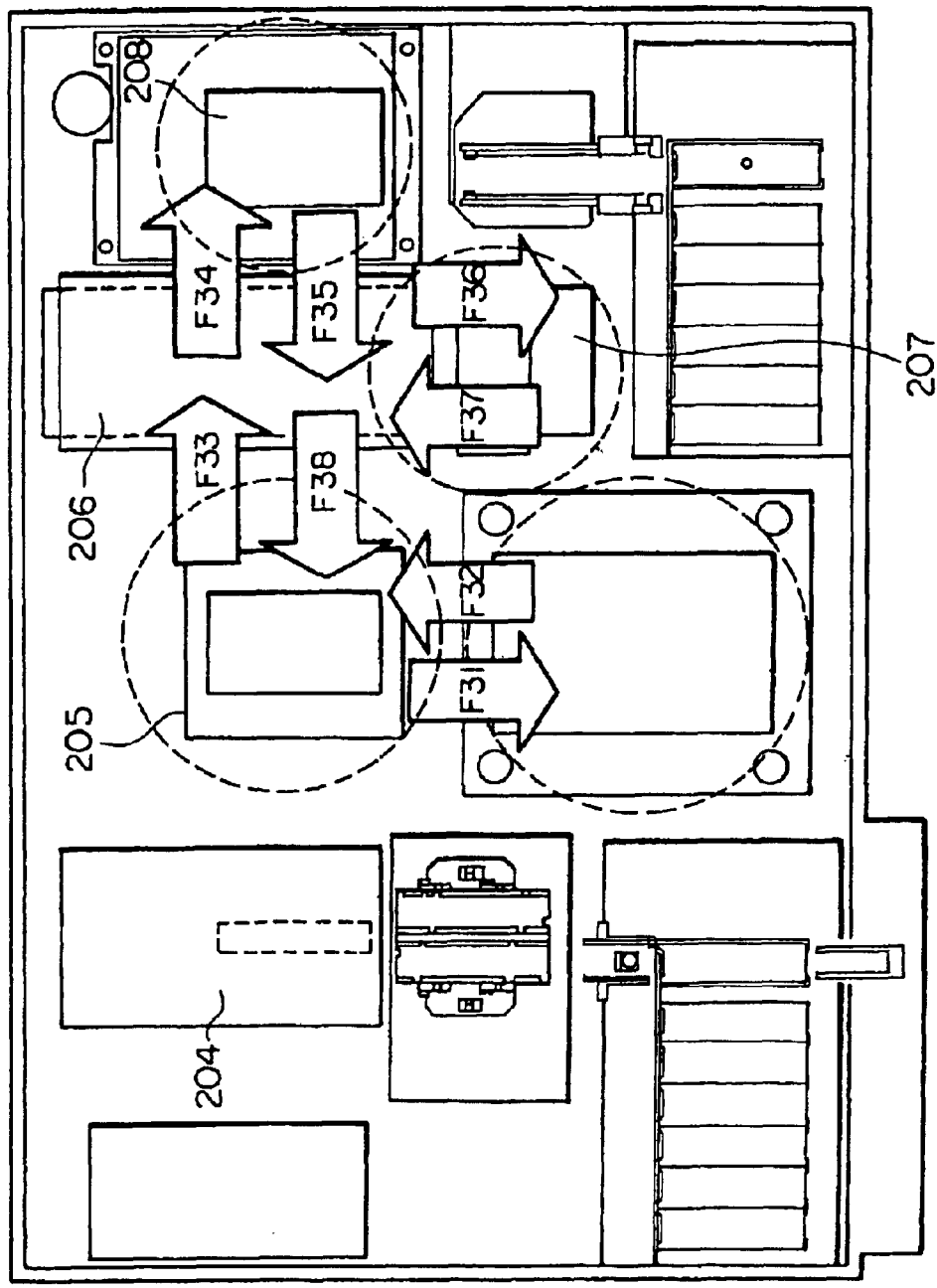
FIG. 6 is an upper view to explain a process for the resin encapsulation system according to a second embodiment of the present invention.

Referring to FIGS. 4A, 4B and 6, the upper mold 102 and the lower mold 103 are fixed on the molding press 104 while two middle molds (a first middle mold and a second middle mold) 101 (Only one of the middle molds 101 is shown in FIG. 4A.) remain free without being fixed on the upper mold 102 and the lower mold 103.

The first middle mold 101 stays at the middle mold preheating unit 205 while the second middle mold 101 is at the ejecting pressing unit 208.

The first middle mold 101 is conveyed to/set on the molding press 104 from the middle preheating unit 205 by the middle-mold off-loader 206.

At that time, the second middle mold 101 is moved as shown by arrow F35 such that it is set on its exclusive middle-mold cleaning unit 207 to be moved back and forth inside the middle-mold cleaning unit 207 for cleaning as shown by arrows F36 and F37.

After cleaning, the middle mold 101 is moved as shown by arrow F38 such that it is conveyed to/set on the middle preheating unit 205 by the middle-mold off-loader 206 to receive an object to be encapsulated which is conveyed by a loader carrier 204 and the middle mold 101.

The first middle mold 101 moves to the ejecting pressing unit 208 after completion of encapsulation process as shown by arrows F32 to F34 to have the encapsulated object separated from the first middle mold 101 and to have a runner and a gate separated from the middle mold 101.

The second middle mold 101 is conveyed to/set on the molding press 104 by the middle-mold off-loader 206 as shown by arrow 31 after the first middle mold 101 is removed from the molding press 104 by the middle-mold off-loader 206 to be then delivered to the ejecting pressing unit 208.

While the second middle mold 101 is encapsulated with resin by the molding press 104, the first middle mold 101 is moved as shown by arrow F35 such that it is set on its exclusive middle-mold cleaning unit 207 for cleaning to be moved back and forth as shown by arrows F36 and F37.

After cleaning, the first middle mold 101 is moved as shown by arrow F38 to stay at the middle mold preheating unit 205 to receive an encapsulating object from the loader carrier 204.

By repeating the processes above, the resin encapsulation process is alternately performed while the first and second middle molds 101 are circulated inside the system.

Figure 7:
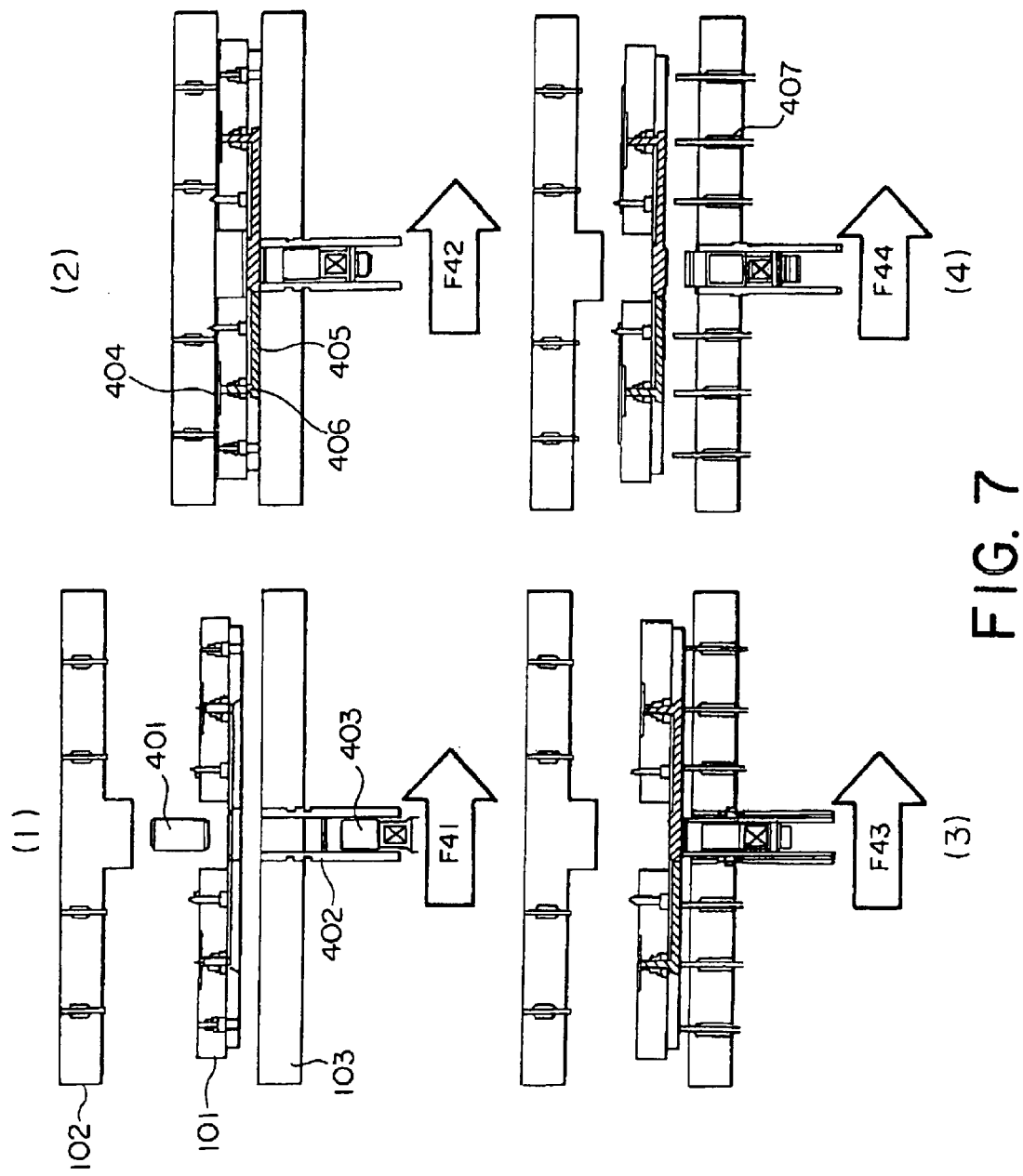
FIG. 7 is a side elevation view to explain processes for the molding press of the resin encapsulation system according to the second embodiment of the present invention, wherein the processes are shown in the order (1), (2), (3) and (4).

Referring to FIGS. 4A, 4B and 7, the detailed workings of the molding press 104 in the processes above are described.

As shown by arrow F41, after setting previously the middle mold 101 on the lower mold 103 of the molding press 104 by the middle-mold off-loader 206, then setting previously the middle mold 101 with the object to be encapsulated on the lower mold 103, a tablet 401 is inserted into a pot block 402 of the lower mold 103.

After the lower mold 103 is lifted and held by pressure on the upper mold 102 via the middle mold 101 by the predetermined pressure as shown by arrow F42, the tablet 401 is injected by lifting a plunger 403 to perform filling and curing of the resin (injecting molding) for the cavity portion 404 formed on the middle mold 101 via a runner portion 405 and gate portion 406 formed on the middle mold 101.

As shown by arrow F43, after the process above, the lower mold 103 and the middle mold 101 are lowered to make the plastic mold open.

As shown by arrow F44, after opening the mold, the middle mold 101 together with the runner 405 and the gate 406 are removed simultaneously from the lower mold 103 by an ejector mechanism 407 mounted on the lower mold 103 for releasing the plastic mold.

By repeating the processes above, a molding operation at the molding press 104 is alternately performed at the first and second middle molds 101.

Figure 8:
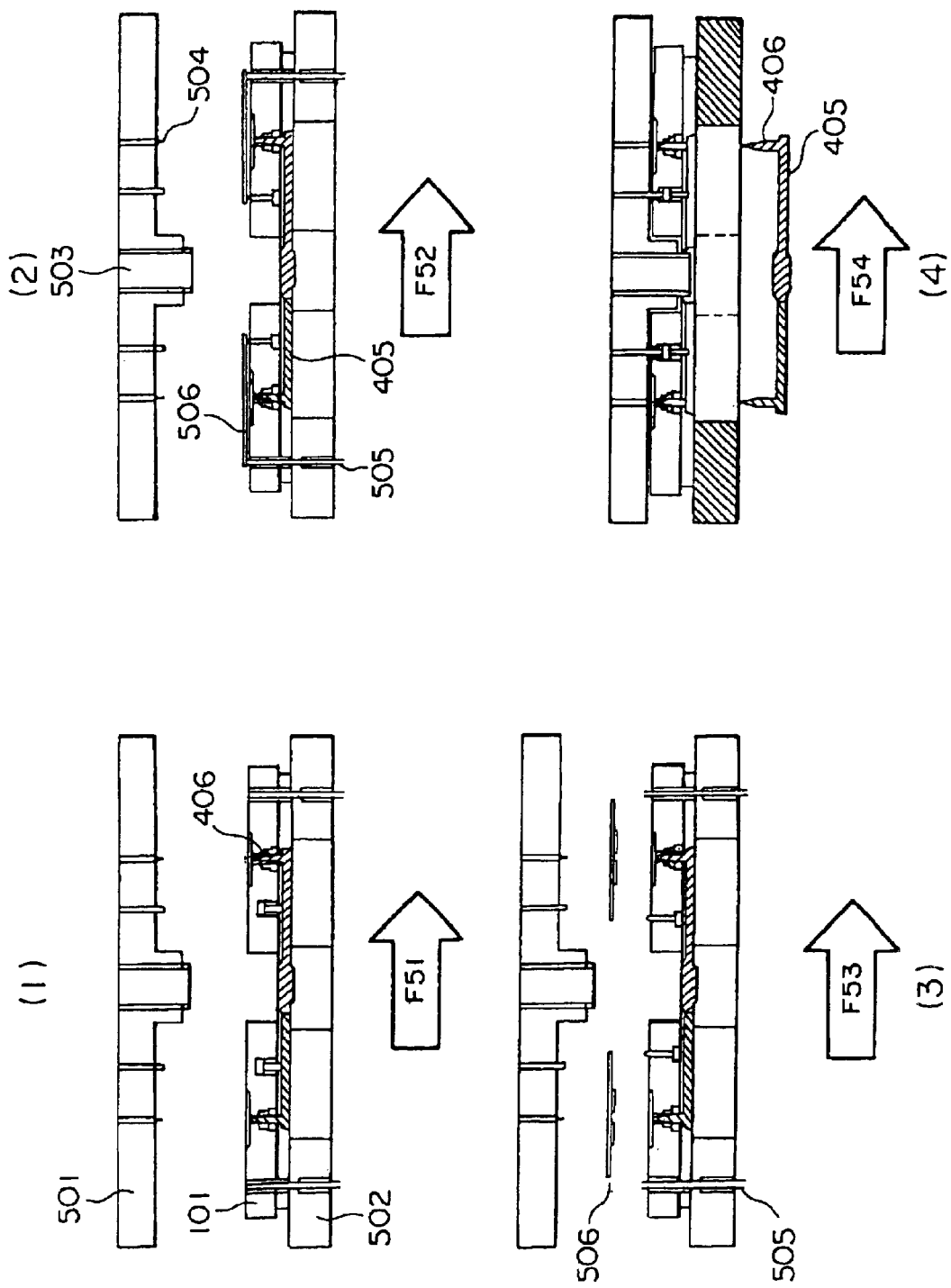
FIG. 8 is a side elevation view to explain processes for ejecting pressing unit of the resin encapsulation system according to the second embodiment of the present invention, wherein the processes are shown in the order (1), (2), (3) and (4).

Referring to FIGS. 4A, 4B and 8, the detailed workings of the ejecting pressing unit 208 in the resin encapsulation processes described above are described.

The middle mold 101 released from the lower mold 103 at the molding press 104 is conveyed to the ejecting pressing unit 208 in a state that the runner 405 and the gate 406 together with an encapsulated object 506 are adhered closely, to be set on a lower ejector die 502 (arrow F51).

Firstly, only the encapsulated object 506 is removed from the set middle mold 101 by an ejector mechanism 505 for releasing (arrow F52).

Next, the released object that has been encapsulated is removed (arrow F53).

Then the gate 406 and the runner 405 formed on the middle mold 101 are pushed out by an ejector die 501 comprising a pin for pushing gate 504 and a punch 503 (arrow F54).

By repeating the processes above, processes at the ejecting pressing unit 208 are alternately performed at the first and second middle molds 101.

Although one or two molds are used for one molding press according to the first embodiment and the second embodiment above, the present invention is not limited by these embodiments and the encapsulation process can be performed more efficiently by using several molding presses and several middle molds for conveying them by a conveying hand without overlapping.

As described above, in the resin encapsulation system according to the present invention, one or more middle molds remain free without being mechanically connected with the upper mold and the lower mold. Resin encapsulation molding is performed while the middle mold is circulated among the molding press, the middle-mold preheating unit, the middle-mold cleaning unit, and the ejecting pressing unit adapted to separate the encapsulated object, the runner, and the gate from the middle mold by the ejector mechanism. Thereby, according to the present invention, an efficient resin encapsulation system that is as low-cost as the conventional art and that allows automated mass production can be provided.

What is claimed is:

1. A resin encapsulation system comprising:
   a molding press using an upper mold, a middle mold and a lower mold, wherein, a middle mold conveying mechanism is provided, which inserts/removes the middle mold into/from said molding press, wherein a runner portion is formed on the lower mold.

2. A resin encapsulation system according to claim 1, further comprising:

a middle-mold preheating unit;

a middle-mold cleaning unit; and an ejecting pressing unit to separate an encapsulated object, and a gate from the middle mold, wherein, the middle mold is circulated among the molding press, the middle-mold preheating unit, the middle-mold cleaning unit, and the ejecting pressing unit by said middle-mold conveying mechanism.

3. A resin encapsulation system according to claim 1, wherein a plurality of said middle-mold conveying mechanisms are provided.

4. A resin encapsulation system according to claim 1, wherein a cavity portion and a gate portion for performing resin encapsulation in the middle mold with resin are provided.

5. A resin encapsulation system according to claim 1, wherein a plurality of said middle molds are provided.

6. A resin encapsulation system according to claim 1, wherein an ejector mechanism is provided on the lower mold.

7. A resin encapsulation system according to claim 3, wherein a plurality of said molding presses are provided.

8. A resin encapsulation system according to claim 6, wherein said ejector pressing unit ejects the encapsulated object, the runner and the gate separately.

9. The resin encapsulation system according to claim 1, wherein the middle mold is provided with a notch, wherein the notch enables the middle mold conveying mechanism to grasp the middle mold during insertion and removal of the middle mold from said molding press.

10. The resin encapsulation system according to claim 1, wherein a cavity portion and a gate portion are formed on the middle mold.

* * * * *